United States Patent [19]

Dingwall

[11] 4,240,093

[45] Dec. 16, 1980

[54] INTEGRATED CIRCUIT DEVICE INCLUDING BOTH N-CHANNEL AND P-CHANNEL INSULATED GATE FIELD EFFECT TRANSISTORS

[75] Inventor: Andrew G. F. Dingwall, Bridgewater, N.J.

[73] Assignee: RCA Corporation, New York, N.Y.

[21] Appl. No.: 749,410

[22] Filed: Dec. 10, 1976

Related U.S. Application Data

[63] Continuation-in-part of Ser. No. 585,874, Jun. 11, 1975, abandoned.

[51] Int. Cl.³ .................. H01L 27/02; H01L 29/78; H01L 29/34
[52] U.S. Cl. .................................. 357/42; 357/23; 357/52; 357/89
[58] Field of Search ........................... 357/23, 41, 42

[56] References Cited

U.S. PATENT DOCUMENTS

| | | | |
|---|---|---|---|
| 3,315,096 | 4/1967 | Carlson et al. | 357/41 |
| 3,608,189 | 9/1971 | Gray | 357/42 |
| 3,712,995 | 1/1973 | Steudel | 357/42 |
| 3,786,319 | 1/1974 | Tomisaburo | 357/41 |
| 3,806,371 | 4/1974 | Barone | 357/42 |
| 3,868,721 | 2/1975 | Davidsohn | 357/41 |
| 3,886,583 | 5/1975 | Wang | 357/42 |

OTHER PUBLICATIONS

RCA COS/MOS Integrated Circuits Manual, (3/71), p. 24–26, RCA, Somerville, N.J.

*Primary Examiner*—Gene M. Munson
*Attorney, Agent, or Firm*—Birgit E. Morris; Donald S. Cohen; Sanford J. Asman

[57] ABSTRACT

A complementary MOS integrated circuit device, adapted for fabrication with relatively high circuit density, includes relatively fast transistors with a closed gate geometry. Permanently-off gates surround transistors to isolate them from other transistors.

A method of making this structure involves self-aligned gate techniques in which the sources and drains are defined as regions which surround the gates and are surrounded by the gates, respectively.

11 Claims, 11 Drawing Figures

INTEGRATED CIRCUIT DEVICE INCLUDING BOTH N-CHANNEL AND P-CHANNEL INSULATED GATE FIELD EFFECT TRANSISTORS

This application is a Continuation-In-Part of U.S. Patent application Ser. No. 585,874, filed on June 11, 1975 now abandoned.

This invention relates to integrated circuit devices of the type which include insulated gate field effect transistors (IGFETs) as active elements therein. The invention is a novel structure for a complementary insulated gate field effect integrated circuit device and a novel method of making that structure.

In one known form, complementary IGFET integrated circuit devices are made from a substrate body of semiconductive material, usually silicon of N type conductivity, which has a principal surface. Well regions of P type conductivity are formed adjacent to this surface in localized portions of the substrate body. N-channel transistors are fabricated within the boundaries of the well regions and P-channel transistors are formed outside the well regions.

Each transistor in such known structures comprises a source region and a drain region spaced apart by a channel region. Transistors often are isolated from the leakage effects of undesired surface inversion by means of so-called guard bands, one of which surrounds each transistor which must be isolated. Because of breakdown effects, space must be left between each guard hand and the transistor which it surrounds and space must be left outside the guard bands between adjacent guard bands. The result of these spacings is that substantial silicon "real estate" is required for each transistor. A need has existed for a structure which can provide higher circuit component density than has previously been available.

An important feature of the present novel device is a closed geometry for the transistors thereof. Each transistor in the present device comprises a relatively small drain region surrounded by a frame-like gate structure, which is preferably of the self-aligned type. The source of each transistor is a region which surrounds the frame-like gate structure. In discrete transistor form, devices having this geometry have been known for some time. See for example, Carlson et al., U.S. Pat. No. 3,315,096 issued Apr. 18, 1967. Integrated circuit devices are also known in which transistors having closed geometries have been employed, as described for example in Gray, U.S. Pat. No. 3,608,189 issued Sept. 28, 1971. For high frequency or fast applications, the closed geometry is superior to open or linear geometry because it provides a transistor having a relatively low drain-to-substrate capacitance, a parameter which has limited the speed of known open-geometry insulated gate field-effect transistors.

Figure 1:
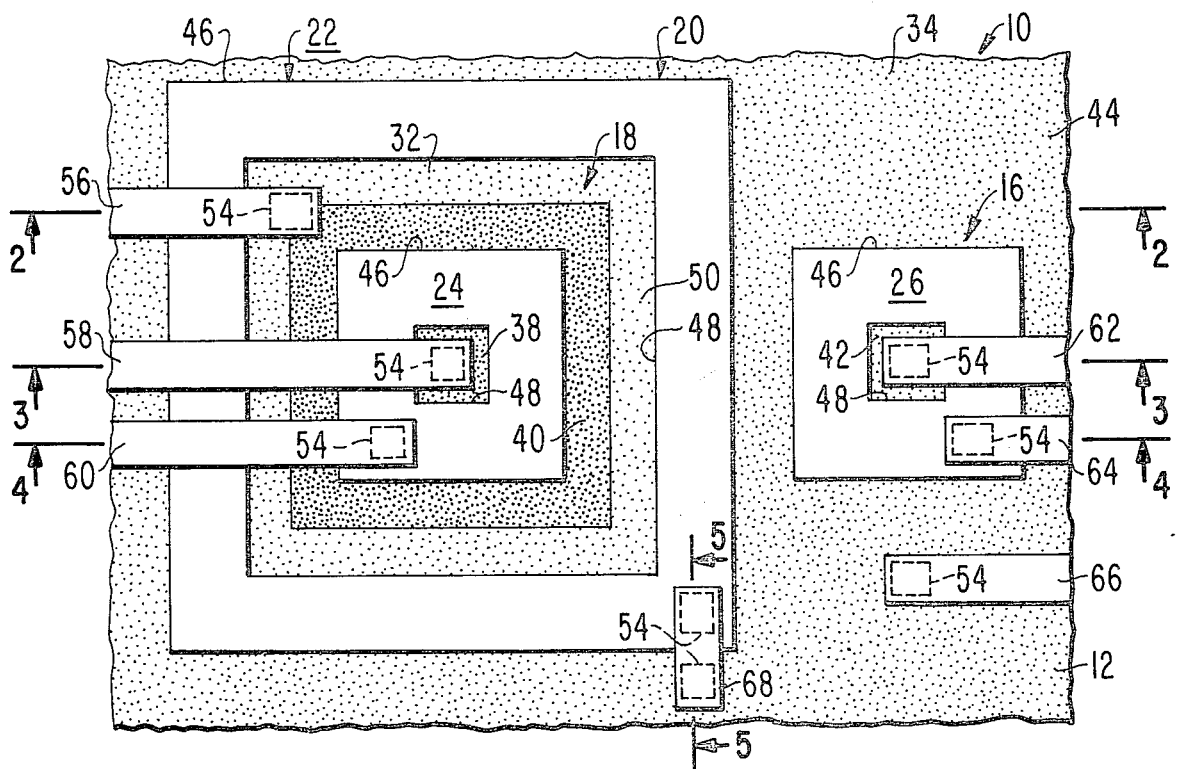
FIG. 1 is a plan view of a portion of an integrated circuit device, illustrating the construction of one N-channel and one P-channel insulated gate field effect transistor therein.
Figure 2:
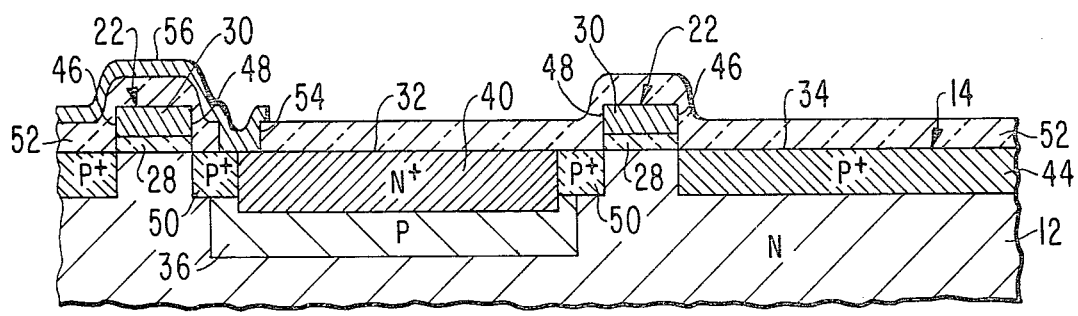
FIG. 2 is a cross-section taken along the line 2—2 of FIG. 1.
Figure 3:
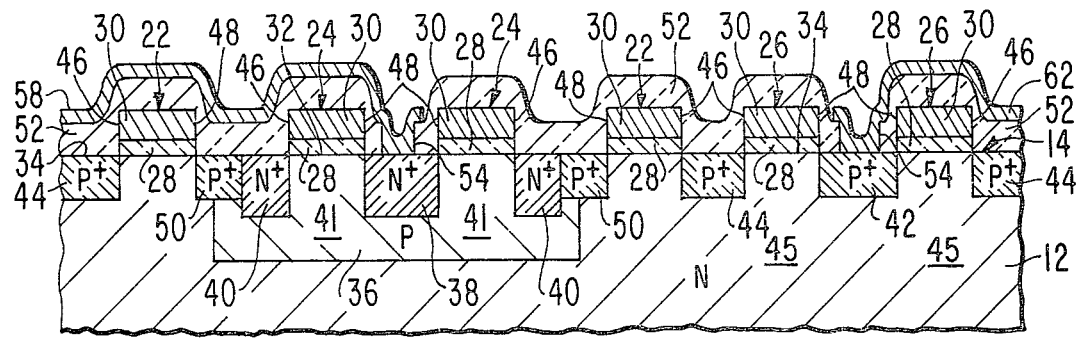
FIG. 3 is a cross-section taken along the line 3—3 of FIG. 1.
Figure 4:
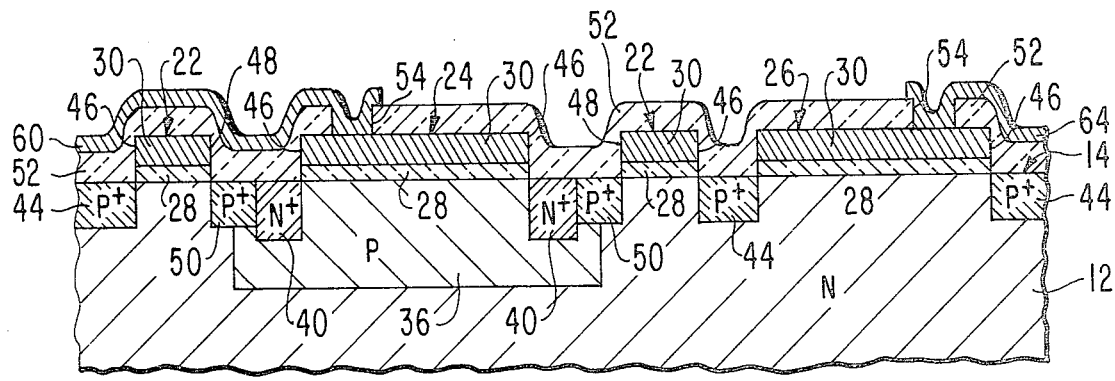
FIG. 4 is another cross-section taken along the line 4—4 of FIG. 1.

A portion of an integrated device 10 of the complementary IGFET type having the features of the present invention is illustrated in FIG. 1. The device 10 comprises a body 12 of semiconductive material such as silicon, which is initially of one type of conductivity (N type in this example) and which has a surface 14 (See FIGS. 2,3,4, and 5). In this example, the body 12 is a bulk silicon body, but other forms of semiconductor material may also be used. For example, the body 12 may be an epitaxial layer on an insulating substrate, in the so-called silicon-on-sapphire technology.

Means including the body 12, that is, source, drain and channel regions in the body 12 and gate electrode means on the surface 14, define a P channel IGFET 16 and an N channel IGFET 18, together with means 20 for isolating the P channel transistor 16 from the N channel transistor 18. These various means comprise a first frame-like structure 22, hereafter called a guard gate, a second frame-like structure 24, and a third frame-like structure 26, each hereafter called an active gate. Each of these gate structures includes a layer 28 (FIGS. 2 to 5) of insulating material and a layer 30 of conductive material on the layer 28 of insulating material. Although the layers 28 and 30 in any one gate structure are separate from the corresponding layers in each of the other frame-like structures, the same reference numeral is applied to each of the respective insulating and conductive layers for convenience.

Each of the gate structures 22, 24 and 26 has a closed geometry. By this is meant that the gate structures have the configuration of a closed pattern which has an opening therein. While rectangular structures are shown, any suitable topologically closed shame may be adopted. The rectangular shape is preferred, for its adaptability to integrated circuit structures of relatively high packing density.

The guard gate 22 surrounds a first portion 32 of the surface 14 and is surrounded by a second portion 34 of the surface 14. The active gate 24 is disposed on the first portion 32 of the surface 14 and the active gate 26 is disposed on the second portion 34 of the surface 14. While the active gate 24 is shown in FIG. 1 as centered within the guard gate 22, this configuration is not required and in fact, the guard gate 22 may be much larger with respect to the active gate 24 than is shown, so that other frame-like gate structures like the active gate 24 may be disposed on the first portion 32 of the surface 14. See FIG. 11 for example, the structure of which will be described later.

A well region 36 of conductivity type opposite to that of the body 12, P type in this example, is in the body 12 adjacent to the first portion 32 of the surface 14. A region 38 of N+ type conductivity is within the P well region 36 adjacent to a part of the surface 14 which is surrounded by the active gate 24. Another region 40 of N+ type conductivity is within the P well region 36 adjacent to a part of the surface 14 which surrounds the active gate 24. The regions 38 and 40 define the ends of a channel zone 41 for the transistor 18.

A region 42 of P+ type conductivity is in the body 12 adjacent to a part of the surface 14 which is surrounded by the active gate 26, and another region 44 of P+ type conductivity is in the body 12 adjacent to a part of the surface 14 which surrounds the active gate 26. The regions 42 and 44 define the ends of a channel zone 45 for the transistor 16.

Owing to the process which is used to make the device 10, which process involves self-aligned gate techniques like those disclosed by Kerwin et al in U.S. Pat. No. 3,475,234 issued Oct. 28, 1969, each of the gate structures 22, 24 and 26 has an inner peripheral boundary and an outer peripheral boundary. For convenience, the outer peripheral boundaries of the gate structures are each designated by the reference numeral 46 and the inner peripheral boundaries are designated by the reference numeral 48. Each of the regions 38, 40, 42, and 44 has a surface-intecept boundary substantially contiguous with one or the other of an inner or an outer peripheral boundary of a gate structure.

Means including a part of the first portion 32 of the surface 14 is provided for establishing ohmic contact to the well region 36. In this example, this means includes a region 50 of P+ type conductivity, of doping density higher than the doping density in the well region 36. The region 50 lies adjacent to that part of the first portion 32 of the surface 14 which lies between the guard gate 22 and the active gate 24. In this example, although not required, the region 50 surrounds the region 40.

An insulating coating 52 overlies substantially all of the surface of the device 10 and has apertures 54 therein for permitting contact to be made to the various regions and conductive layers. The layer 52 may be composed of, for example, a chemical vapor deposited glass.

A source-substrate conductor 56 has a portion thereof extending through an opening 54 into contact with both the P+ type region 50 and the N+ type region 40. A drain conductor 58 has a portion thereof extending through an opening 54 into contact with the region 38. A gate conductor 60 extends through an opening 54 into contact with the conductive layer 30 of the active gate 24. A drain conductor 62 extends into contact with the region 42 in the transistor 16. A gate conductor 64 extends into contact with the conductive layer 30 of the active gate 26, and a source conductor 66 extends into contact with the region 44.

Figure 5:
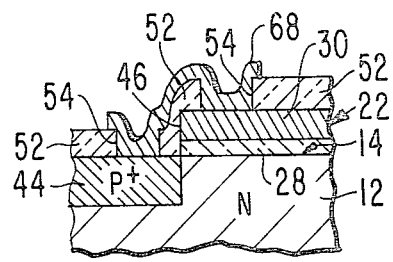
FIG. 5 is a partial cross-section taken along the line 5—5 of FIG. 1.
Figure 6:
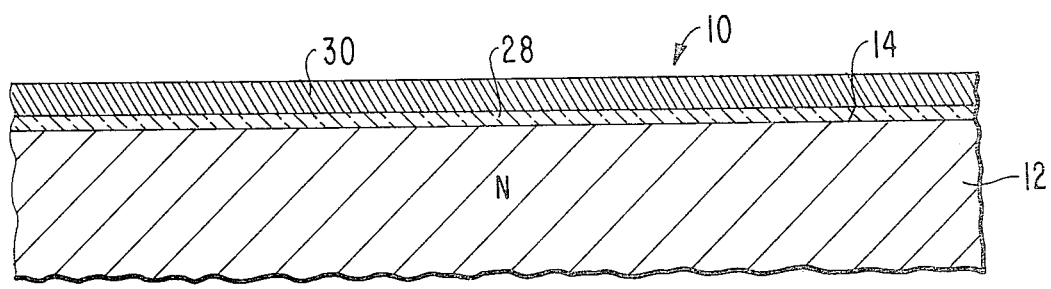
FIGS. 6–10 are a series of cross-sections illustrating various steps in the present novel method.
Figure 7:
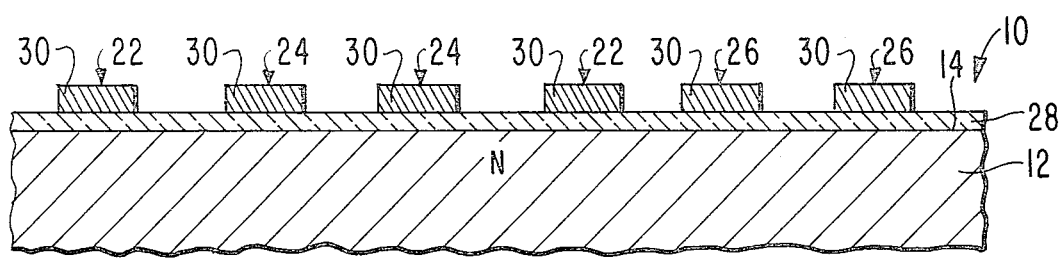

The guard gate 22 provides a means for isolating the transistor 16 from the transistor 18. In the operation of the device, this gate may be considered to be a permanently-off gate an in order to produce the permanently-off condition, means are provided for electrically coupling the layer of conductive material 30 in the guard gate 22 with the P+ type region 44. As shown in FIGS. 1 and 5 this latter means comprises a conductor 68 which extends through apertures 54 into contact with the guard gate 22 and the region 44.

The several conductors shown in FIGS. 1 to 5 do not interconnect the transistors 16 and 18 together to perform any circuit function, inasmuch as the structure described here is generally applicable to many different circuit configurations. Modifications of the structure thus far described and examples of the ways in which the modified structures may be connected in certain circuit configurations will be described below with respect to FIG. 11. Before that however, the present novel method will be described.

FIGS. 6 to 10 illustrate one embodiment of the present novel method, particularly the application of the method to a bulk semiconductor body. For convenience, the cross-sections of FIGS. 6 to 10 show only the configuration in the plane of the cross-section.

In this example, the process begins with a semiconductor body 12 of silicon N type conductivity which has a surface 14. The first step in the present process is to grow the insulating layer 28 on the surface 14. Preferably, this step is accomplished by heating the body 12 to a temperature of about 875° C. in an atmosphere of steam and a small quantity of HCl gas for a time sufficient to grow the layer 28 to a thickness of approximately 1000 Å.

After the completion of the growth of the insulating layer 28, the body 12 is placed in a deposition reactor and layer 30 of conductive material, preferably polycrystalline silicon, is deposited thereon. Any known deposition reaction may be employed, preferably the thermal decomposition reaction of silane ($SiH_4$). The process is carried out for a time sufficient to grow the layer 30 to a thickness of approximately 3000 Å. Using conventional photolithographic technology involving a first photomask (not shown) the layer 30 is next defined into the pattern of the frame-like gate structures 22, 24, and 26. See FIG. 7.

The next step is to deposit a layer 70 of photoresist (FIG. 8) on the upper surface of the body 12 and to define this layer of photoresist, using a second photomask, into the pattern which defines the boundaries of the P well 36. Note that the boundaries 72 of the photoresist layer 70 lie well inside the inner edge of the layer 48 in the guard gate 22. The reason for this will be made clear in the description of the succeeding steps.

With the layer 70 of photoresist in place, the body 12 is placed in an ion implantation machine and boron is implanted at sufficiently high energy so that it penetrates both the polycrystalline material 30 of the active gate 24 and the gate oxide layer 28. The ion implantation is schematically shown by a series of arrows in FIG. 8, and the result of the implantation is a region 36S in the body 12 beneath the active gate 24 and beneath a part of the surface 14 which surrounds the active gate 24 and another part which is surrounded by the active gate 24.

Figure 9:
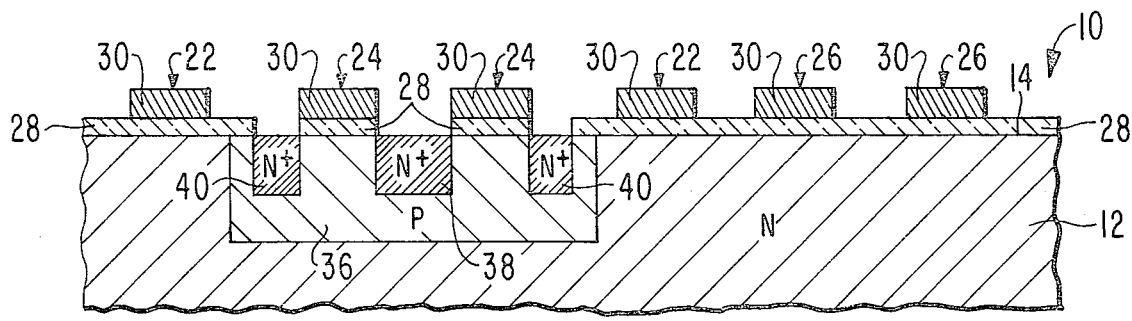

The photoresist coating is left in place after the ion implantation step and the wafer is next placed in a solvent for silicon dioxide such as buffered HF in order to remove those portions of the layer 28 which are not covered by either the photoresist or the polycrystalline silicon 30 of the active gate 24. The result of this step, after the subsequent removal of the photoresist, is shown in FIG. 9, which also illustrates the next step in the process.

After the removal of the photoresist layer 70 the next step is to redistribute the conductivity modifiers in the regions 36S to form the P well region 36, by heating the device to a temperature of about 1200° C. for about 20 hours. After the completion of the drive-in diffusion of the P well 36, the next step in the process is to diffuse phosphorus into the body 12 through the unmasked areas thereof as shown in FIG. 9 to form the N+ type regions 38 and 40. This step is conventionally performed and results also in the diffusion of phosphorus into the polycrystalline silicon material of the conductive layer 30.

Without employing an additional photomask at this point, the device 10 is contacted with a solvent for silicon dioxide to remove those remaining portions of the layer 28 which are not covered by the polycrystalline silicon material of the several gate structures. This step therefore completes the fabrication of the gates 22, 24 and 26.

Figure 10:
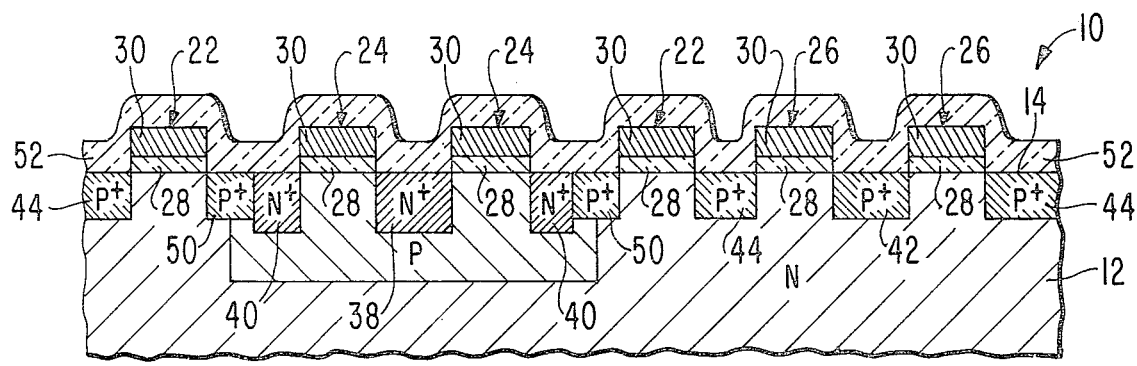

The next step is to diffuse boron, by conventional processes, into the uncovered portions of the surface 14. The result of this step is illustrated in FIG. 10. After the boron diffusion, P+ type regions 42, 44 and 50 are present. Boron will also be diffused into portions of the N+ type region 40, which are also exposed during this step, and the concentration of modifiers in the region 40 should be sufficiently high, i.e. about $10^{21}$ atom/cm$^3$, so that the material thereof is not reconverted to P type by this boron diffusion.

The next step is to deposit the glass coating 52. This may be accomplished in any desired manner and preferably is done by chemical vapor deposition processes. The final steps in the method are conventional, involving the use of a third and a fourth photomask. The third photomask is used to define the locations of the apertures 54 in the glass coating 52. After that definition step, a continuous layer of aluminum is deposited on the surface and the fourth photomask is used to define the various conductors 56, 58 etc. The fabrication of the device is then complete.

As a result of this processing, the establishing of contact from the top side of the device to the material of the body 12 is difficult. This is so because all N+ type diffusions are surrounded by a P well and consequently contact to the substrate without an interposed PN junction is not possible. Contact can be readily made however to the body 12 at the back side of the wafer (not shown).

It is possible to fabricate devices designed for the four photomask technology described here using a more conventional process using five photomasking steps. In the five photomask process, the well region 36 is created in the conventional manner prior to the first step in the sequence described above. The N+ type regions 38 and 40 are then defined in a photomasking step at the appropriate time in the process by using a mask designed to expose the area of the well region 36 as well as at least one additional area outside the well region 36, into which phosphorus diffusion may take place. The remainder of the fabrication sequence is identical. Advantages of the five photomask process are that a high energy boron implant is not required, contact to the N type substrate can be made in the conventional manner via the additional N+ type area (not shown), and the N+ layer which need no longer be identical with the well diffusion can be used for channel stoppers, diffused power buses, etc.

Figure 11:
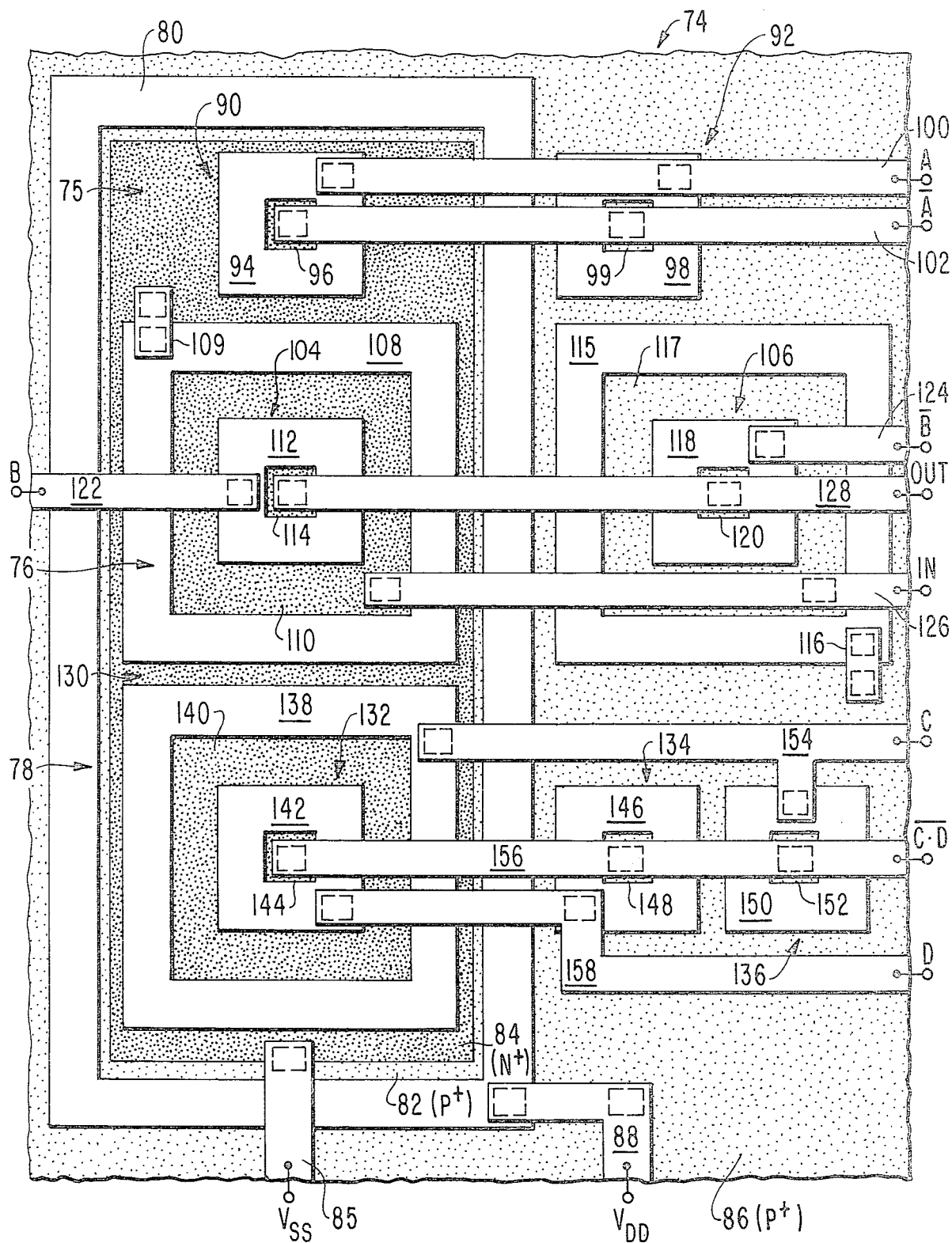
FIG. 11 is a partial plan view of an integrated circuit device illustrating the manner in which N-channel and P-channel transistors may be combined to provide certain circuit functions.

FIG. 11 illustrates by way of example, how transistors constructed with the structure and by the process described above can be interconnected to perform certain logic functions. The structure shown in FIG. 11 is a plan view of a portion of an integrated circuit device 74. The logic circuit arrangements are an inverter 75, located at the top of the figure, a transmission gate 76, located in the central portion of the figure, and a two input NAND gate 78, located at the lower portion of the figure.

The logic circuit arrangements shown in FIG. 11 each include at least one N channel transistor and one P channel transistor. In the embodiment shown, there is one P well region, made like the P well region 36, which lies within the boundaries of a guard gate 80 serving to isolate all the N channel transistors from all the P channel transistors. Visibly adjacent to the inside boundary of the guard gate 80 in FIG. 11 is a P+ type region 82 similar to the P+ type region 50 of FIG. 1. An N+ type source plane region 84 lies inside the P+ type region 82, and both the P+ type region 82 and the N+ type region 84 are contacted by a conductor 85 adapted to be coupled to a source of relatively low voltage, designated $V_{SS}$. This connection is also made to the P well of the device 74 via the region 82.

Outside the boundaries of the guard gate 80 there is a P+ type source plane region 86. A conductor 88 is coupled to both the guard gate 80 and the source plane region 86 and may be connected to a terminal for providing a source of relatively high potential designated $V_{DD}$.

The inverter 75 comprises an N channel transistor 90 and a P channel transistor 92. The soiurce of the N channel transistor 90 is the N+ tupe source plane region 84. The gate 94 of the transistor is a frame-like structure like the other frame-like structures. The drain of the transistor 90 is a region 96 of N+ type conductivity inside the gate 94. The source of the P channel transistor 92 is the P+ type source plane region 86. The transistor 92 has a gate 98, and a drain 99 of P+ type conductivity. A conductor 100 interconnects the gate 94 and the gate 98 of the transistors 90 and 92 respectively and may be connected to an input terminal labelled A. A conductor 102 interconnects the drain 96 and the drain 98 of the transistors 90 and 92 respectively and may be connected to an output terminal labelled $\overline{A}$. The operation of the inverter 75 is the same as the operation of known complementary metal-oxide-silicon (CMOS) inverters.

The transmission gate 76 comprises two transistors 104 and 106. An important feature of the present invention is that means are conveniently available in this technology to isolate the transistors 104 and 106 from the other transistors either in the N+ type source plane 84 or the P+ type source plane 86. This may be accomplished by surrounding the transistor 104 by an isolating gate 108 and then providing a conductor 109 which couples that gate 108 with the region 84 in order to maintain the region under the gate 108 in a permanently off condition. Consequently, there is another region 110 of N+ type conductivity which results when the gate 108 is used and the region 110 constitutes the source region for the transistor 104. The gate of the transistor 104 is a gate 112 and the drain thereof is an N+ type region 114 therewithin.

An isolating gate 115 similar to the isolating gate 108 surrounds the transistor 106 and defines another P+ type region 117, which constitutes the source of the transistor 106. The gate of the transistor 106 is a gate 118 and the drain of the transistor 106 is the P+ region 120 therewithin. A conductor 116 couples the guard gate 115 with the P+ type source plane 86 to maintain the area under the gate 115 in a permanently off condition.

A conductor 122 is coupled to the gate 112 of the transistor 104 and may be connected to a terminal of the device for providing on the gate 112 a control signal designated B. A conductor 124 is coupled to the gate 118 of the transistor 106 and is adapted to be connected to a terminal of the device for the application of a control signal B having a polarity opposite to that of the control signal applied to the conductor 122. An input conductor 126 is coupled to the respective source regions 110 and 117. An output conductor 128 is connected to the respective drain regions 114 and 120. This construction operates as a complementary transmission gate in known manner similar to the operation of transmission gates in known CMOS structures.

the NAND gate 78 illustrates how transistors can be connected in series and in parallel in the present technology. The NAND gate 78 comprises two N channel transistors 130 and 132 having their source to drain conduction channels connected in series, as will appear hereinafter, and two P channel transistors 134 and 136, having their source to drain conduction channels connected inl parallel. The source of the transistor 130 is the N+ type source plane 84. The gate of the transistor 130 is a structure 138, like the other frame-like structures, which surrounds a region 140 of N+ type conductivity. This latter region 140 is a common drain for the transistor 130 and source for the transistor 132. The transistor 132 has a gate 142 and a drain 144 constituted by an N+ type region within the gate 142. The transistor 134 has a source constituted by the P+ type source plane 86, a gate 146, and a P+ type drain region 148. Similarly, the transistor 136 has a source constituted by the P+ type source plane 86, a gate 150, and a P+ type drain region 152.

A conductor 154 connects the gate 138 of the transistor 130 with the gate 150 of the transistor 136 and may be connected to a terminal of the device designated by the letter C. A conductor 156 interconnects the drain 144 of the transistor 132, the drain 148 of the transistor 134 and the drain 152 of the transistor 136 and constitutes an output conductor for this NAND gate, labelled $\overline{C.D}$. A conductor 158 is connected to the gate 142 of the transistor 132 and to the gate 146 of the transistor 134 and may be connected to a terminal of the device labelled D.

In the operation of the NAND gate 78, if the potentials at terminals C and D are both high, that is at $V_{DD}$, the transistor 130 will be on, the transistor 132 will be on, and both the transistors 134 and 136 will be off. In this case, the signal appearing on the output terminal $\overline{C.D}$ will be substantially equal to $V_{SS}$. If both the terminals C and D are low, i.e. at $V_{SS}$, the transistors 130 and 132 will be off, while the transistors 134 and 136 will be on, in which case the output appearing at the terminal $\overline{C.D}$ will be substantially equal to $V_{DD}$. When C is high and D is low, the transistor 130 will be on, the transistor 132 will be off. Under these conditions, the output at $\overline{C.D}$ will also be at the potential of $V_{DD}$. If D is high and C is low the transistor 130 will be off and the transistor 132 will be on, the transistor 134 will be off and the transistor 136 will be on, in which case the output at $\overline{C.D}$ will also be at $V_{DD}$. There is hence only one logic state in which the output at $\overline{C.D}$ will be at $V_{SS}$, that is, when both C and D are at $V_{DD}$, so that the structure performs the logic NAND function.

Other logic functions can be realized in this technology and are not described here as their construction will be apparent to those of ordinary skill when provided with this disclosure. More transistors may be connected in series in the manner of the connection of transistors 130 and 132 by surrounding the gates of these transistors with an additional gate, not shown, but there is a limit to this technique inasmuch as each transistor in the series is much wider than the transistor next within it and thus the transconductances of the several transistors will be much different. In most circuits too wide a variation in the transconductances of the several transistors therein is not desirable.

The structure and the method disclosed herein has several advantages over known CMOS technology. The device does not rely on guardbands for isolation of devices and therefore does not require the guardband spacings of prior devices, making it adaptable to circuit densities much higher than have been obtained in known CMOS devices heretofore. The construction of the transistors in the closed-geometry form has the benefit of providing improved transconductance-to-drain-capacitance ratios for the transistors, which makes them faster than known IC devices. Owing to the ground plane feature disclosed in FIG. 11, source contact is not required for each transistor in a given integrated circuit device.

While the device described herein does not rely on guardbands for isolation of individual transistors and therefoe does not require the guardband spacings of prior devices, there are applications for integrated circuits made in accordance with the invention which require the use of at least one guardband adjacent, and typically surrounding, the isolation gate which separates the N channel devices from the P channel devices. The single guardband would be used in integrated circuits made in accordance with the invention in order to prevent a possible latch-up which might otherwise result if the bias on the isolation gate did not cut off current flow under the isolation gate prior to the onset of current flow in other portions of the integrated circuit. Such a problem may result because the lower conductivity of polycrystalline silicon, when compared to metals, such as aluminum, means that it may take some finite time for enough charge to build up on the polycrystalline silicon gate to adequately isolate the N channel devices from the P channel devices. In some circuit configurations, a latch-up, in which the PNPN structure of the CMOS device acts as a turned-on silicon controlled rectifier, can occur due to current flow beneath the isolation gate prior to the time the isolation gate becomes effective to isolate the N channel devices from the P channel devices. In order to prevent that from occuring without imposing constraints upon circuit designers which would require them to design circuits in which power supplies are turned on in a specified order or manner, a single guardband may be formed adjacent the isolation gate to prevent current flow under the isolation gate. In particular, an N+ guardband surrounding the guard gate 22 would be effective in suppressing parasitic action.

Figure 8:
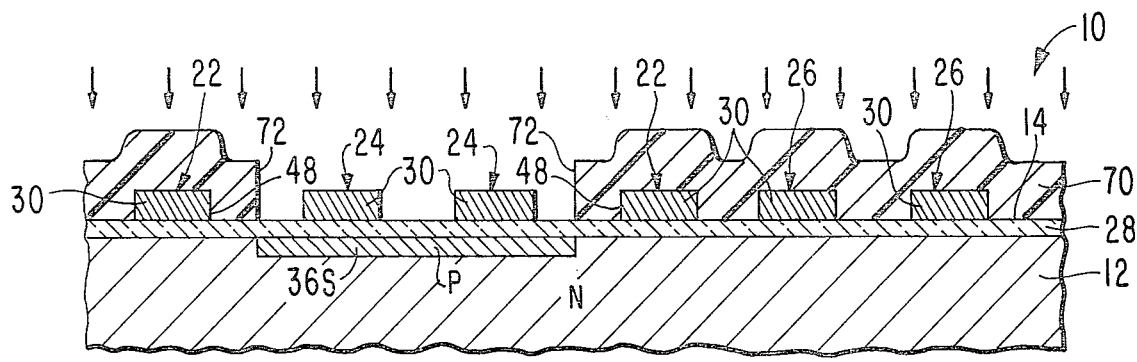

In the present novel process as few as four photomasks may be used to make any given device. This leads to lower cost and simpler fabrication thus raising yields and making fabrication of the devices more economical. Yields are also improved by the fact that in the process three diffusions are put in from one photomask alignment, that is, the alignment required to form the photoresist layer 70 (FIG. 8). This alignment is not a critical alignment because the boundaries 72 of the photoresist layer 70 may vary in location widely from device to device without sacrificing performance or yield. The four mask process does have the disadvantage pointed out above of making top substrate contact relatively difficult. However, the five mask technique does not possess this problem.

What is claimed is:
1. An integrated circuit device comprising:
  (a) a body of semiconductor material predominantly of one conductivity type, said body having a surface;

(b) a first frame-like structure including a layer of insulating material on said surface and a layer of conductive material on said layer of insulating material, said first frame-like structure having a closed geometry which encloses a first portion of said surface and separates said first portion of said surface from a second portion of said surface;

(c) a well region having a conductivity type opposite that of said body, said well region extending into said body only from said first portion of said surface;

(d) means for making ohmic contact to said well region, said means being totally surrounded by said first frame-like structure and comprising a part of said first portion of said surface;

(e) at least one semiconductor device extending into said well region from said first portion of said surface, said semiconductor device comprising:

(i) a second frame-like structure including a layer of insulating material on said first portion of said surface and a layer of conductive material on said layer of insulating material, said second frame-like structure having a closed geometry separating an outer portion of said first portion of said surface from an inner portion of said first portion of said surface;

(ii) a first region of the same conductivity type as said body extending into said well region from said inner portion of said first portion of said surface, said first region being surrounded by said second frame-like structure;

(iii) a second region of the same conductivity type as said body extending into said well region from said outer portion of said first portion of said surface, said second region surrounding said second frame-like structure;

(f) at least one semiconductor device extending into said body from said second portion of said surface, said semiconductor device comprising:

(i) a third frame-like structure including a layer of insulating material on said second portion of said surface and a layer of conductive material on said layer of insulating material, said third frame-like structure having a closed geometry separating an outer portion of said second portion of said surface from an inner portion of said second portion of said surface, (ii) a third region of opposite conductivity type to said body extending into said body from said inner portion of said second portion of said surface, said third region being surrounded by said third frame-like structure;

(iii) a fourth region of opposite conductivity type to said body extending into said body from said outer portion of said second portion of said surface, said fourth region surrounding said third frame-like structure.

2. The integrated circuit device of claim 1 wherein said means for making ohmic contact includes a contact region of the same conductivity type as said well region and of higher doping density than said well region adjacent to a part of said portion of said surface which lies between said first frame-like structure and said second frame-like structure.

3. The integrated circuit device of claim 2 wherein said contact region immediately surrounds said second region.

4. The integrated circuit device of claim 3 wherein each of said frame-like structures has an inner peripheral boundary and an outer peripheral boundary, said contact region having a surface intercept boundary substantially contiguous with the inner peripheral boundary of said first frame-like structure.

5. The integrated circuit device of claim 4 wherein each of said regions has a surface intercept boundary substantially contiguous with at least the inner or the outer peripheral boiundary of a frame-like structure.

6. The integrated circuit device of claim 1 wherein said fourth region surrounds said first frame-like structure.

7. The integrated circuit device of claim 6 further comprising means for electrically coupling the layer of conductive material in said first frame-like structure with said fourth region.

8. An integrated circuit device comprising:

(a) a body of semiconduct or material predominantly of one conductivity type, said body having a surface;

(b) a first frame-like structure including a layer of insulating material on said surface and a layer of conductive material on said layer of insulating material, said first frame-like structure having a closed geometry which separates a first portion of said surface from a second portion of said surface;

(c) a well region having a conductivity type opposite that of said body, said well region extending into said body from said first portion of said surface;

(d) means for making ohmic contact to said well region, said means including a part of said first portion of said surface;

(e) at least one semiconductor device extending into said well region from said first portion of said surface, said semiconductor device comprising:

(i) a second frame-like structure including a layer of insulating material on said first portion of said surface and a layer of conductive material on said layer of insulating material, said second frame-like structure having a closed geometry separating an outer portion of said first portion of said surface from an inner portion of said first portion of said surface;

(ii) a first region of the same conductivity type as said body extending into said well region from said inner portion of said first portion of said surface, said first region being surrounded by said second frame-like structure;

(iii) a second region of the same conductivity type as said body extending into said well region from said outer portion of said first portion of said surface, said second region surrounding said second frame-like structure;

(f) at least one additional semiconductor device extending into said well region from said first portion of said surface, said additional semiconductor device comprising:

(i) a third frame-like structure including a layer of insulating material on said outer portion of said first portion of said surface and a layer of conductive material on said layer of insulating material, said third frame-like structure having a closed geometry separating two portions of said outer portion of said first portion of said surface;

(ii) a third region of the same conductivity type as said body extending into said well region from one of said two portions of said outer portion, said third region being surrounded by said third frame-like structure;

(iii) a fourth region of the same conductivity type as said body extending into said body into said well region from the other of said two portions of said outer portion, said fourth region surrounding said thrid frame-like structure; and (g) at least one semiconductor device extending into said body from said second portion of said surface, said semiconductor device comprising:

(i) a fourth frame-like structure including a layer of insulating material on said second portion of said surface and a layer of conductive material on said layer of insulating material, said fourth frame-like structure having a closed geometry separating an outer portion of said second portion of said surface from an inner portion of said second portion of said surface, (ii) a fifth region of opposite conductivity type to said body extending into said body from said inner portion of said second portion of said surface, said fifth region being surrounded by said third frame-like structure;

(iii) a sixth region of opposite conductivity type to said body extending into said body from said outer portion of said second portion of said surface, said fourth region surrounding said fourth frame-like structure.

9. The integrated circuit device of claim 8 in which said third frame-like structure surrounds said second frame-like structure.

10. An integrated circuit device comprising:

(a) a body of semiconductor material predominantly of one conductivity type, said body having a surface;

(b) a first frame-like structure including a layer of insulating material on said surface and a layer of conductive material on said layer of insulating material, said first frame-like structure having a closed geometry which separates a first portion of said surface from a second portion of said surface;

(c) a well region having a conductivity type opposite that of said body, said well region extending into said body from said first portion of said surface;

(d) means for making ohmic contact to said well region, said means including a part of said first portion of said surface;

(e) at least one semiconductor device extending into said well region from said first portion of said surface, said semiconductor device comprising:

(i) a second frame-like structure including a layer of insulating material on said first portion of said surface and a layer of conductive material on said layer of insulating material, said second frame-like structure having a closed geometry separating an outer portion of said first portion of said surface from an inner portion of said first portion of said surface;

(ii) a first region of the same conductivity type as said body extending into said well region from said inner portion of said first portion of said surface, said first region being surrounded by said second frame-like structure;

(iii) a second region of the same conductivity type as said body extending into said well region from said outer portion of said first portion of said surface, said second region surrounding said second frame-like structure;

(f) at least one semiconductor device extending into said body from said second portion of said surface, said semiconductor device comprising:

(i) a third frame-like structure including a layer of insulating material on said second portion of said surface and a layer of conductive material on said layer of insulating material, said third frame-like structure having a closed geometry separating an outer portion of said second portion of said surface from an inner portion of said second portion of said surface, (ii) a third region of opposite conductivity type to said body extending into said body from said inner portion of said second portion of said surface, said third region being surrounded by said third frame-like structure;

(iii) a fourth region of opposite conductivity type to said body extending into said body from said outer portion of said second portion of said surface, said fourth region surrounding said third frame-like structure; and (g) at least one additional semiconductor device extending into said body from said second portion of said surface comprising:

(i) a fourth frame-like structure including a layer of insulating material on said outer portion of said second portion of said surface and a layer of conductive material on said layer of insulating material, said fourth frame-like structure having a closed geometry separating two portions of said outer portion of said second portion of said surface;

(ii) a fifth region of opposite conductivity type to said body extending into said body from one of said two portions of said outer portion, said fifth region being surrounded by said fourth frame-like structure;

(iii) a sixth region of opposite conductivity type to said body extending into said body from the other of said two portions of said outer portion, said sixth region surrounding said fourth frame-like structure.

11. The integrated circuit device of claim 10 wherein said fourth frame-like structure surrounds said third frame-like structure.

* * * * *

UNITED STATES PATENT AND TRADEMARK OFFICE
CERTIFICATE OF CORRECTION

PATENT NO. : 4,240,093  Page 1 of 2
DATED : December 16, 1980
INVENTOR(S) : Andrew Gordon Francis Dingwall It is certified that error appears in the above—identified patent and that said Letters Patent is hereby corrected as shown below:

Column 1, line 31 : "hand" should be --band--;
             line 52 : after "to" insert --an--;
Column 2, line 41 : "shame" should be --shape--;
Column 3, line 18 : "intecept" should be --intercept--;
             line 50 : "an" should be --and--;
Column 4, line 5 : After "silicon" insert --of--;
             line 12 : "A" should be --Å--;
Column 6, line 16 : "soiurce" should be --source--;
             line 17 : "tupe" should be --type--;
             line 64 : "B" should be --B̄--;
Column 7, line 4 : "the" should be --The--;
             line 11 : "inl" should be --in--;

UNITED STATES PATENT AND TRADEMARK OFFICE
CERTIFICATE OF CORRECTION

PATENT NO. : 4,240,093
DATED     : December 16, 1980
INVENTOR(S) : Andrew Gordon Francis Dingwall It is certified that error appears in the above—identified patent and that said Letters Patent is hereby corrected as shown below:

Column 8 , line 17 :   "therefoe" should be --therefore--;
Column 10, line 10 :   "boiundary" should be --boundary--;
         line 19 :   "semiconduct" should be --semiconductor--;
         line 19 :   delete "or".

Signed and Sealed this

Twenty-fourth Day of March 1981

[SEAL]

Attest:

RENE D. TEGTMEYER

Attesting Officer    Acting Commissioner of Patents and Trademarks